United States Patent
Donofrio et al.

(10) Patent No.: US 9,496,458 B2
(45) Date of Patent: Nov. 15, 2016

(54) SEMICONDUCTOR LIGHT EMITTING DIODES WITH CRACK-TOLERANT BARRIER STRUCTURES AND METHODS OF FABRICATING THE SAME

(71) Applicant: Cree, Inc., Durham, NC (US)

(72) Inventors: Matthew Donofrio, Raleigh, NC (US); Michael Bergmann, Raleigh, NC (US); Kevin Haberern, Cary, NC (US); Kevin Schneider, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/790,369

(22) Filed: Mar. 8, 2013

(65) Prior Publication Data

US 2013/0328096 A1    Dec. 12, 2013

Related U.S. Application Data

(60) Provisional application No. 61/657,347, filed on Jun. 8, 2012.

(51) Int. Cl.
| | |
|---|---|
| *H01L 33/12* | (2010.01) |
| *H01L 33/60* | (2010.01) |
| *H01L 33/44* | (2010.01) |
| *H01L 33/62* | (2010.01) |

(52) U.S. Cl.
CPC ............... *H01L 33/12* (2013.01); *H01L 33/44* (2013.01); *H01L 33/62* (2013.01); *H01L 2924/0002* (2013.01); *H01L 2933/0025* (2013.01); *H01L 2933/0066* (2013.01)

(58) Field of Classification Search
CPC ...... H01L 33/00; H01L 33/12; H01L 33/36; H01L 33/40; H01L 33/44; H01L 33/48; H01L 33/46; H01L 33/50; H01L 33/52; H01L 33/58; H01L 33/60; H01L 33/62; H01L 33/64
USPC ................. 257/99, 79, 80, 82, 88, 98
See application file for complete search history.

(56) References Cited

U.S. PATENT DOCUMENTS

| | | | |
|---|---|---|---|
| 2004/0035909 A1* | 2/2004 | Yeh et al. ............ | 228/56.3 |
| 2005/0087754 A1 | 4/2005 | Erchak | |
| 2009/0038683 A1* | 2/2009 | Walter et al. ............ | 136/263 |
| 2009/0283787 A1 | 11/2009 | Donofrio et al. | |
| 2011/0127568 A1* | 6/2011 | Donofrio et al. ........... | 257/99 |
| 2011/0156070 A1* | 6/2011 | Yoon et al. .............. | 257/98 |

(Continued)

FOREIGN PATENT DOCUMENTS

WO    WO 2005/056879 A1    6/2005

OTHER PUBLICATIONS

Notification of Transmittal of the International Search Report and the Written Opinion of the International Searching Authority, or the Declaration, PCT/US2013/042599, Date of Mailing: Nov. 13, 2013, 11 pages.

(Continued)

*Primary Examiner* — Chuong A Luu
(74) *Attorney, Agent, or Firm* — Myers Bigel, P.A.

(57) ABSTRACT

A light emitting device includes an epitaxial region, an insulating layer on the epitaxial region, a bond pad on the insulating layer, and a crack reducing feature in the insulating layer. The crack reducing feature is configured to reduce the propagation of cracks in the insulating layer to an outside surface of the insulating layer. Related methods are also disclosed.

25 Claims, 10 Drawing Sheets

(56) References Cited

U.S. PATENT DOCUMENTS

2011/0303942 A1* 12/2011 Hasnain et al. ............... 257/98
2012/0121478 A1   5/2012 Kumar
2012/0138969 A1*  6/2012 Moon ................... H01L 33/382
                                                       257/88
2013/0264592 A1* 10/2013 Bergmann et al. ............ 257/88

OTHER PUBLICATIONS

Sharpe, Jr., et al., "Strain Measurements of Silicon Dioxide Microspecimens by Digital Imaging Process,", Society for Experimental Mechanics, 2007.

PCT International Preliminary Report on Patentability, mailed Dec. 18, 2014 for PCT international Appication No. PCT/US2013/042599 (2 pages).

PCT Written Opinion of the International Searching Authority, mailed Nov. 13, 2013 for PCT International Application No. PCT/US2013/042599 (8 pages).

* cited by examiner

SEMICONDUCTOR LIGHT EMITTING DIODES WITH CRACK-TOLERANT BARRIER STRUCTURES AND METHODS OF FABRICATING THE SAME

CROSS REFERENCE TO RELATED APPLICATIONS

The present application claims the benefit of and priority to U.S. Provisional Patent Application No. 61/657,347, filed Jun. 8, 2012, the disclosure of which is hereby incorporated herein by reference in its entirety.

BACKGROUND

This invention relates to semiconductor light emitting devices and methods of fabricating same, and more particularly to semiconductor Light Emitting Diodes (LEDs) and fabrication methods therefor.

Semiconductor LEDs are widely known solid-state lighting elements that are capable of generating light upon application of voltage thereto. LEDs generally include a diode region having first and second opposing faces, and including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with one ultimate goal being a replacement for the ubiquitous incandescent lightbulb.

SUMMARY

Embodiments of the present invention provide a thermally robust reflective barrier structure for an LED chip, in which the barrier structure includes a dielectric material. The barrier structure incorporates stress reducing/decoupling structures to make the reflective barrier structure tolerant of cracks that can occur during various manufacturing processes. For example, stress can be generated in the dielectric barrier layer during heating/cooling due to differences in the thermal coefficients of expansion of various materials in the chip structure. In some embodiments, the dielectric barrier layer can include mechanical structures, layers, trenches or other features formed in or on the dielectric/barrier layer to decouple portions of the dielectric/barrier layer from each other.

For example, according to some embodiments, trenches can be formed in or through the dielectric barrier layer to decouple stress in the interior portion of the chip from the portions of the dielectric material at the edge of the chip. In other embodiments, the dielectric barrier structure can include a crack reducing interlayer between upper and lower portions of the dielectric barrier layer that precludes or reduces the stress from the die attach metals on the upper dielectric layer from transferring to the lower dielectric barrier layer. In various embodiments, additional dielectric and/or metal layers and/or one or more alternating layers may be used. Additionally, combinations of mechanical separations and multiple layer structures may be used.

Dielectric layers in an LED chip structure may be subject to cracking due to thermal stress, particularly when die attach metals are directly on the dielectric layer and the part is mounted onto a package submount using a reflow process where there are various stresses due to coefficient of thermal expansion (CTE) mismatches between the materials. When the dielectric layer is used as a barrier layer to prevent migration of metal within the chip, cracks may present a reliability risk and yield loss due to metal migration or loss of insulation between electrodes.

Some embodiments of the present invention reduce the risk of metal migration by providing a more robust dielectric barrier layer. In some embodiments, a multilayer stack that has one or more crack reducing interlayers embedded within a dielectric layer or positioned between adjacent dielectric layers may substantially prevent cracks formed in an upper dielectric layer adjacent a die attach metal from propagating to a lower dielectric layer. In some embodiments, the crack reducing interlayer can be patterned so that there is no continuity between the area under a cathode bond pad and the area under an anode bond pad to avoid having a current leakage path that can occur if there is any migration of die attach or other metals, such as Sn, Ag, etc., through any cracks.

The crack reducing interlayer may be a metal layer that is electrically floating or may be electrically connected to the underlying device. For example, the portion of a metal crack reducing interlayer under the anode bond pad may be electrically coupled to the anode bond pad, and the portion of the metal crack reducing interlayer under a cathode bond pad may be electrically connected to the cathode bond pad.

In other embodiments, mechanical structures can be formed in the dielectric barrier to decouple/isolate the stresses. For example, a trench may be formed in or through the dielectric barrier layer to mechanically decouple portions of the dielectric barrier under the anode and/or cathode bond pads from portions of the dielectric barrier near the edges of the chip structure, which may be more susceptible to metal migration due to cracking of the dielectric barrier.

A light emitting device according to some embodiments includes an epitaxial region, an insulating layer on the epitaxial region, a bond pad on the insulating layer, and a crack reducing layer between the insulating layer and the bond pad. The crack reducing layer is configured to reduce the propagation of cracks in the insulating layer between the epitaxial layer and the bond pad.

The crack reducing layer may be embedded within the insulating layer.

The insulating layer may include an aperture, with the bond pad extending through the aperture. The bond pad may extend laterally over the crack reducing layer so that the crack reducing layer is between the bond pad and the epitaxial region.

A periphery of the bond pad may lie within a periphery of the crack reducing layer.

The bond pad may include a cathode bond pad, and the light emitting device may further include an anode bond pad on the insulating layer. The crack reducing layer may include a first portion between the anode bond pad and the epitaxial region and a second portion between the cathode bond pad and the epitaxial region. The first and second portions of the crack reducing layer may be separated from one another.

The first portion of the crack reducing layer may be separated from the anode bond pad by the insulating layer and the second portion of the crack reducing layer may be separated from the cathode bond pad by the insulating layer.

The first portion of the crack reducing layer may be in contact with the anode bond pad and the second portion of the crack reducing layer may be in contact with the cathode bond pad.

The crack reducing layer may include a metal and/or a polymer material.

The light emitting diode may further include a trench in the insulating layer surrounding the bond pad. The trench may extend completely through the insulating layer or may extend into, but not completely through the insulating layer.

The light emitting diode may further include a metal layer on the epitaxial region, with the insulating layer between the metal layer and the bond pad, and the trench may extend completely through the insulating layer to the metal layer.

The insulating layer may cover an outermost edge of the metal layer.

The crack reducing layer may be exposed in the trench and/or may be separated from the trench by the insulating layer.

A light emitting device according to some embodiments includes an epitaxial region, an insulating layer on the ohmic contact, a bond pad on the insulating layer, and a crack reducing feature in the insulating layer. The crack reducing feature is configured to reduce the propagation of cracks in the insulating layer to an outside surface of the insulating layer.

The crack reducing feature may include crack reducing interlayer in the insulating layer and/or a trench in the insulating layer.

Methods of forming a light emitting diode according to some embodiments include providing an epitaxial region, providing an insulating layer on the epitaxial region, providing a bond pad on the insulating layer, and providing a crack reducing layer between the insulating layer and the bond pad. The crack reducing layer is configured to reduce the propagation of cracks in the insulating layer between the epitaxial layer and the bond pad.

The methods may further include forming a metal layer on the epitaxial region such that the crack reducing layer is between the metal layer and the bond pad.

Providing the insulating layer and the crack reducing layer may include forming a first insulating layer on the metal layer, forming a crack reducing layer on the first insulating layer, and forming a second insulating layer on the crack reducing layer.

The methods may further include forming an aperture through the crack reducing layer and the insulating layer, and forming the bond pad in the aperture, the bond pad extends on to a surface of the insulating layer opposite the metal layer.

The methods may further include providing a trench in the insulating layer around the bond pad.

A light emitting device according to further embodiments includes an epitaxial region, an insulating layer on the epitaxial region, a bond pad on the insulating layer, and an interlayer between the insulating layer and the bond pad. The insulating layer has a brittle fracture mode and the interlayer has a ductile fracture mode.

A light emitting device according to further embodiments includes an epitaxial region, a first insulating layer on the epitaxial region, a second insulating layer on the first insulating layer, a metal layer between the first and second insulating layers, and a bond pad on the second insulating layer opposite the epitaxial region.

A light emitting device according to further embodiments includes an epitaxial region, an insulating layer on the epitaxial region, a bond pad on the insulating layer opposite the epitaxial region, and a metal layer embedded in the insulating layer between the epitaxial region and the bond pad.

BRIEF DESCRIPTION OF THE DRAWINGS

The accompanying drawings are included to provide a further understanding of the disclosure and are incorporated in and constitute a part of this application. In the drawings.

DETAILED DESCRIPTION

Figure 1:
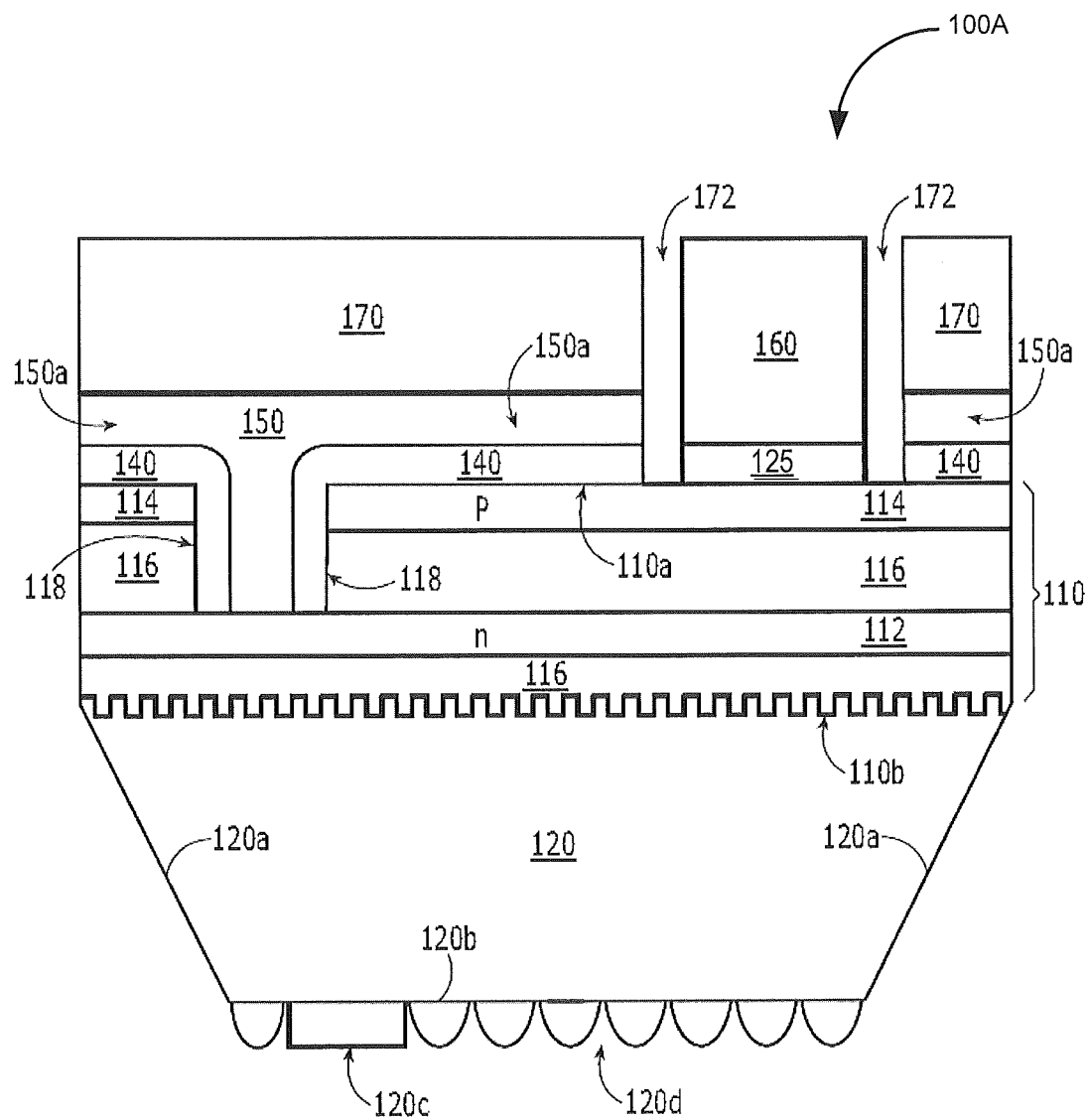
FIGS. 1 and 2 are cross-sectional views of light emitting diodes according to various embodiments.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. The term "directly" means that there are no intervening elements. As used herein, the term "and/or" includes any and all combinations of one or more of the associated listed items and may be abbreviated as "/". The term "layer" can include multi-layer structures, such as multilayer insulating layers and/or multilayer active layers that include layers of different materials laminated together to form a unitary structure.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region of an LED is considered to be "transparent" to a given wavelength of light if light at that wavelength passes through the layer or region without significant loss, for example when at least 70%, in some cases at least 80%, and in some cases at least 90%, of the radiation from the LED that impinges on the transparent layer or region emerges through the transparent region. For example, in the context of blue and/or green LEDs that are fabricated from gallium nitride-based materials, silicon dioxide can provide a transparent insulating layer, whereas indium tin oxide (ITO) can provide a transparent conductive layer as measured by considering transmitted and reflected components on a sapphire substrate. Moreover, as used herein, a layer or region of an LED is considered to be "reflective" to a given wavelength of light if light at that wavelength is reflected by the layer or region without significant loss, for example, when at least 70%, in some cases at least 80%, and in some cases at least 90%, of the angle averaged radiation that impinges on the reflective layer or region from the LED is reflected back into the LED. For example, in the context of gallium nitride-based blue and/or green LEDs, aluminum (for example, at least 80% reflective at visible wavelengths) may be considered reflective materials. In the case of ultraviolet (UV) LEDs, appropriate materials may be selected to provide a desired, and in some embodiments high, reflectivity and/or a desired, and in some embodiments low, absorption.

Some embodiments now will be described generally with reference to gallium nitride (GaN)-based light emitting diodes on silicon carbide (SiC)-based mounting substrates for ease of understanding the description herein. However, it will be understood by those having skill in the art that other embodiments of the present invention may be based on a variety of different combinations of mounting substrate and epitaxial layers. For example, combinations can include AlGaInP diodes on GaP mounting substrates; InGaAs diodes on GaAs mounting substrates; AlGaAs diodes on GaAs mounting substrates; SiC diodes on SiC or sapphire ($Al_2O_3$) mounting substrates and/or a Group III-nitride-based diode on gallium nitride, silicon carbide, aluminum nitride, sapphire, zinc oxide and/or other mounting substrates. Moreover, in other embodiments, a mounting substrate may not be present in the finished product. In some embodiments, the light emitting diodes may be gallium nitride-based LED devices manufactured and sold by Cree, Inc. of Durham, N.C.

FIG. 1 is a cross-sectional view of a light emitting diode structure 100A according to various embodiments. Referring to FIG. 1, these light emitting diodes include a diode region 110 having first and second opposing faces 110a, 110b, respectively, and including therein an n-type layer 112 and a p-type layer 114. Other layers or regions 116 may be provided which may include quantum wells, buffer layers, etc., that need not be described herein. The diode region 110 also may be referred to herein as an "LED epi region", because it is typically formed epitaxially on a substrate 120. For example, a Group III-nitride based LED epi region 110 may be formed on a silicon carbide growth substrate 120. In some embodiments, as will be described below, the growth substrate 120 may be present in the finished product. In other embodiments, the growth substrate 120 may be removed.

Continuing with the description of FIG. 1, an anode contact 125, also referred to as a "p-contact", ohmically contacts the p-type layer 114 and extends on the first face 110a of the diode region 110. The anode contact 125 may extend to a greater or less extent on the p-type layer 114 than illustrated in FIG. 1. An insulating layer 140 also extends on the first face 110a outside the anode contact 125. The insulating layer 140 may include a transparent material, such as SiN and/or $SiO_2$. The insulating layer may also include a multilayer structure, such as a multi-layered stack of insulating materials. A reflective cathode contact 150, also referred to as an "n-contact" electrically contacts the n-type layer 112 and extends through the insulating layer 140 and onto the insulating layer 140 that is outside the anode contact 125. In some embodiments, the reflective cathode contact 150 may directly and ohmically contact the n-type layer 112. In other embodiments, however, a thin ohmic contact layer (not shown), such as a layer of titanium, may provide the actual ohmic contact to the n-type layer 112. The insulating layer 140 and the reflective cathode contact 150 can provide a hybrid reflective structure or "hybrid mirror", wherein the underlying insulating layer 140 provides an index refraction mismatch or index step to enhance the total internal reflection (TIR) from the reflective layer 150 compared to absence of the underlying insulating layer 140. It will also be understood that, in other embodiments, the insulating layer 140 may comprise multiple sublayers, such as oxide and nitride sublayers to provide, for example, a distributed Bragg reflector. Moreover, the reflective cathode contact 150 may also include a plurality of sublayers.

As also shown in FIG. 1, in some embodiments, a via 118 extends into the first face 110a to expose the n-type layer 112, and the insulating layer 140 extends into the via 118. Moreover, the reflective cathode contact 150 also extends on the insulating layer 140 into the via 118, to electrically, and in some embodiments ohmically, contact the n-type layer 112 that is exposed in the via 118.

An anode bond pad 160 is also provided that is electrically connected to the anode contact 125. A cathode bond pad 170 is also provided that is electrically connected to the reflective cathode contact 150. As shown, the anode and contact pads 160 and 170 extend on the first face 110a in closely spaced apart relation to one another, to define a gap 172 therebetween. The gap may be filled with an insulator as described below. In any embodiments illustrated herein, the gap 172 may occur at any desired position and is not limited to the position illustrated herein. In some embodiments, the cathode bond pad 170 may be made as large as possible, so that it can be directly coupled to a grounded heat sink for enhanced thermal dissipation in a flip-chip mounting configuration, without the need for an intervening electrically insulating layer that could reduce thermal efficiency.

As also shown in FIG. 1, a transparent substrate, such as a transparent silicon carbide growth substrate 120, may be included on the second face 110b of the diode region 110. The transparent substrate 120 may include beveled sidewalls 120a and may also include an outer face 120b that is remote from the diode region 110. As shown, the outer face 120b may be textured. The thickness of the substrate 120, the resistivity of the substrate, geometry of the sidewalls 120a and/or the texturing of the remote face 120b may be configured to enhance the far field emission of radiation from the diode region 110 through the substrate 120. The emission from the diode region 110 may take place directly from the diode region 110 through the substrate 120 and may also take place by reflection from the reflective cathode contact 150 back through the diode region 110 and through the substrate 120. In some embodiments, reflection may also take place from the anode contact 125, as will be described in detail below.

As also shown in FIG. 1, in some embodiments, when the transparent substrate 120 is sapphire, Patterned Sapphire Substrate (PSS) technology may be used to texture the interface between the sapphire substrate 120 and the diode region 110, as shown by the jagged interface between the substrate 120 and the second face 110b of the diode region 110. As is well known, PSS technology may provide texture features that may be, for example, about 3 µm in size on an about 5 µm pitch (feature to feature distance). Other sizes/pitches and/or random sizes/pitches may also be used. The use of PSS technology can enhance the extraction efficiency between the gallium nitride-based diode region 110 and the index mismatched sapphire substrate 120.

Accordingly, some embodiments of the invention can provide an LED that is suitable for flip-chip mounting (i.e., mounting opposite the orientation of FIG. 1), wherein the anode bond pad 160 and the cathode bond pad 170 are mounted on a supporting substrate, such as a printed circuit board or other wiring board, and emission of light takes place through the substrate 120 remote from the anode bond pad 160 and the cathode bond pad 170. Thus, a lateral LED may be provided wherein both the anode contact 125 and the cathode contact 150 extend on a given face of the diode region (i.e., the first face 110a), and emission takes place remote from the anode and cathode contacts 125 and 150, respectively, through the second face 110b of the diode region, and through the substrate 120. In other embodiments, the substrate may be removed so that emission takes place directly from the second face 110b of the diode region 110.

As was noted above, the geometry of the substrate 120 may be configured to provide a desired far field emission pattern, such as Lambertian emission. Moreover, texturing may take place on the sidewalls 120a and/or on the face 120b of the substrate 120. Many different configurations of texturing may be used including random texturing, microlenses, microarrays, scattering regions and/or other optical regions. According to some embodiments, the outer face 120b may be differently textured in a first portion 120c thereof than a second portion 120d thereof, so as to provide an orientation indicator for the light emitting diode. Thus, as shown in FIG. 1, an array of microlenses 120d may be provided except at a given area adjacent the transparent cathode contact, wherein a small bar 120c or other indicator, such as a "+" sign, may be provided. The different texturing on the remote face 120b of the substrate can provide an orientation indicator that can allow pick-and-place equipment to correctly orient the LED for packaging, even if the structure of the LED is not "visible" to the pick-and-place equipment through the textured substrate.

In some embodiments, the anode contact and/or the cathode contact can provide a reflective structure on the first face 110a that is configured to reflect substantially all light that emerges from the first face 110a back into the first face 110a. The reflective structure further includes the insulating layer 140 beneath the cathode contact 150 and extensions thereof 150a. In particular, in some embodiments, the reflective structure reflects the light that emerges from at least 90% of an area of the first face 110a. The reflective structure may comprise reflective materials that themselves reflect at least 90% of the light that impinges thereon. In some embodiments, the anode contact 125 may be a reflective anode contact that ohmically contacts the p-type layer 114. In these embodiments, the reflective structure may be provided by a reflective surface of the anode contact 125 that ohmically contacts the p-type layer 114, a reflective surface of the cathode contact 150 that ohmically contacts the n-type layer 112 and a reflective surface of extensions of the cathode contact, identified as 150a in FIG. 1, that extend onto the first face 110a between the via 118 and the anode contact 125, in combination with the insulating layer 140. In other embodiments, the anode contact 125, may be transparent, and the reflective cathode contact 150, specifically the extensions 150a of the reflective cathode contact 150, may extend onto the transparent anode contact 125 to provide a reflective structure in combination with the insulating layer 140. Thus, in some embodiments, the reflective cathode contact can extend to cover substantially all of the first face that is outside the anode contact with the reflective cathode contact. In other embodiments, the reflective cathode contact can cover substantially all of the first face that is outside the anode contact with the reflective cathode contact, and also can cover at least a portion of the anode contact with the reflective cathode contact. More detailed embodiments will be described below.

Accordingly, some embodiments may provide LEDs with a lateral flip-chip configuration. Some embodiments may provide dual mirrors on the p-type and n-type layers. Moreover, the n-type mirror may be an integrated n-contact mirror that can make electrical contact with at least one n-type layer of the LED epi, and can also extend over at least one p-type contact of the LED epi. The integrated n-contact mirror may include a material, such as aluminum, that is optically reflective to wavelengths generated by the LED epi. The transparent insulating layer and the reflective layer can provide a hybrid reflective structure or "hybrid mirror", wherein the underlying transparent insulating layer provides an index of refraction mismatch or index step to enhance the TIR from the diode region compared to absence of the underlying transparent insulating layer. Moreover, the light emitting face of the LED chip, opposite the mirror(s), may include a growth substrate. The growth substrate may further include a shaped surface, such as tapered sidewalls and/or texturing, for light extraction purposes. The amount of tapering and/or texturing may be related to the total thickness of the LED, including the growth substrate. The geometry of the substrate (e.g., thickness/sidewall bevels) and/or the texturing thereof may be adjusted to achieve desired far-field emission patterns. Moreover, since the substrate need not conduct current, it can have high resistivity so that it can be transparent.

LED chips according to various embodiments may be more rugged or robust than conventional LED chips. In particular, the only exposed surfaces of the LED chip may be solid p- or n-contact portions on one side, and the growth substrate on the other side. In contrast, conventional LED chips may need fragile wire bonds and may include exposed top and/or bottom portions of the LED epi.

Moreover, it has also been found, according to various embodiments, that the provision of a transparent insulating layer between the diode region and the reflective cathode contact may actually enhance the reflectivity from the diode region by providing an index mismatch or index step. Accordingly, as shown, for example, in FIG. 1, the insulating layer 140 can provide an integral optical element for the reflective cathode contact 150, in addition to providing desired electrical insulation for the LED. Moreover, the insulating layer 140 and the reflective cathode contact 150 can provide a hybrid mirror.

An explanation of the operation of the insulating layer 140 as part of a hybrid reflector will now be provided. In particular, LEDs typically include multiple layers of different materials. As a result, light emitted from the active region must typically pass through or across one or more of such layers before exiting the LED. Snell's law dictates that the photons will be refracted as they pass from one material to the next. The angles at which the photons will be refracted will depend upon the difference between the refractive indexes of the two materials and the angle of incidence at which the light strikes the interface.

In an LED, although some reflected light will still escape the LED at some other location, a certain percentage will be totally internally reflected, never escape the LED, and will thus functionally reduce the external efficiency of the LED. Although the individual reduction in the percentage of photons escaping may appear to be relatively small, the cumulative effect can be significant, and LEDs that are otherwise very similar can have distinctly different performance efficiencies resulting from even these small percentage losses.

Snell's law dictates that when light crosses an interface into a medium with a higher refractive index, the light bends towards the normal. Similarly, when light travels across an interface from a medium with a high refractive index to a medium with a lower refractive index, light bends away from the normal. At an angle defined as the critical angle, light traveling from a medium with a high refractive index to a medium with a lower refractive index will be refracted at an angle of 90°; i.e., parallel to the boundary. At any angle greater than the critical angle, an incident ray undergoes total internal reflection (TIR). The critical angle is thus a function of the ratio of the refractive indexes. If the light hits the interface at any angle larger than this critical angle, the light will not pass through to the second medium at all. Instead, the interface reflects the light back into the first medium, a process known as total internal reflection. The loss of light due to this total internal reflection is known as the critical angle loss, and is another factor that reduces the external efficiency of the LED.

Embodiments of a hybrid mirror described herein use index mismatching to enhance total internal reflection (TIR) based on Snell's law. In order to enhance TIR, it is desired to provide a large index change to a lower refractive index material relative to the GaN-based diode region. Thus, any light outside the escape cone angle given by Snell's law is internally reflected back into the diode region, and can have essentially no loss. The reflective cathode contact 150 and/or a reflective anode contact can then be used to reflect the fraction of the light impinging thereon from an omnidirectional light source. Accordingly, both the transparent insulating layer 150 and the reflective cathode contact act as a hybrid reflector according to various embodiments to enhance reflection of light emerging from the diode region back into the diode region.

Other embodiments of the invention can provide a reflective layer for a vertical LED. Thus, light emitting diodes according to various embodiments may also comprise a diode region including therein an n-type layer and a p-type layer, and a contact for one of the n-type layer or the p-type layer. The contact may comprise an insulating layer 140 on the one of the n-type layer or the p-type layer that has an index of refraction that is less than the one of the n-type layer or the p-type layer. A reflective layer 150 is provided that electrically contacts the one of the n-type layer or the p-type layer, and that extends on the transparent insulating layer. Accordingly, the insulating layer 140 can provide an integral optical element for a reflective layer 150 so as to provide a hybrid mirror that can improve the reflectivity of the reflective layer 150 compared to absence of the insulating layer 140, because the transparent insulating layer provides an index mismatch or index step to the diode region 110. In other embodiments, the reflective layer 150 can also electrically contact, and in some embodiments ohmically contact, the one of the n-type layer or the p-type layer, and may extend through the insulating layer 140 to make this contact. In still other embodiments, a second contact may be provided for the other of the n-type layer or the p-type layer. The second contact may comprise a second reflective layer that ohmically contacts the other of the n-type layer or the p-type layer. In other embodiments, the second contact may comprise a transparent conductive layer that ohmically contacts the other of the n-type layer or the p-type layer, and the insulating layer 140 and the reflective layer 150 can both extend onto the transparent conductive layer.

Moreover, various embodiments as described herein can also provide a diode region 110 having first and second opposing faces 110a, 110b, and including therein an n-type layer 112 and a p-type layer 114. A reflective anode contact 125 ohmically contacts the p-type layer and extends on the first face 110a. A reflective cathode contact 150 ohmically contacts the n-type layer and extends on the first face. The reflective anode contact 125 and the reflective cathode contact 150 are configured to reflect substantially all light that emerges from the first face 110a back into the first face 110a. Stated differently, the reflective cathode contact 150 can cover substantially all of the first face 110a that is outside the anode contact 125. Moreover, in other embodiments, the reflective cathode contact 150 can also cover at least a portion of the anode contact 125.

Figure 2:
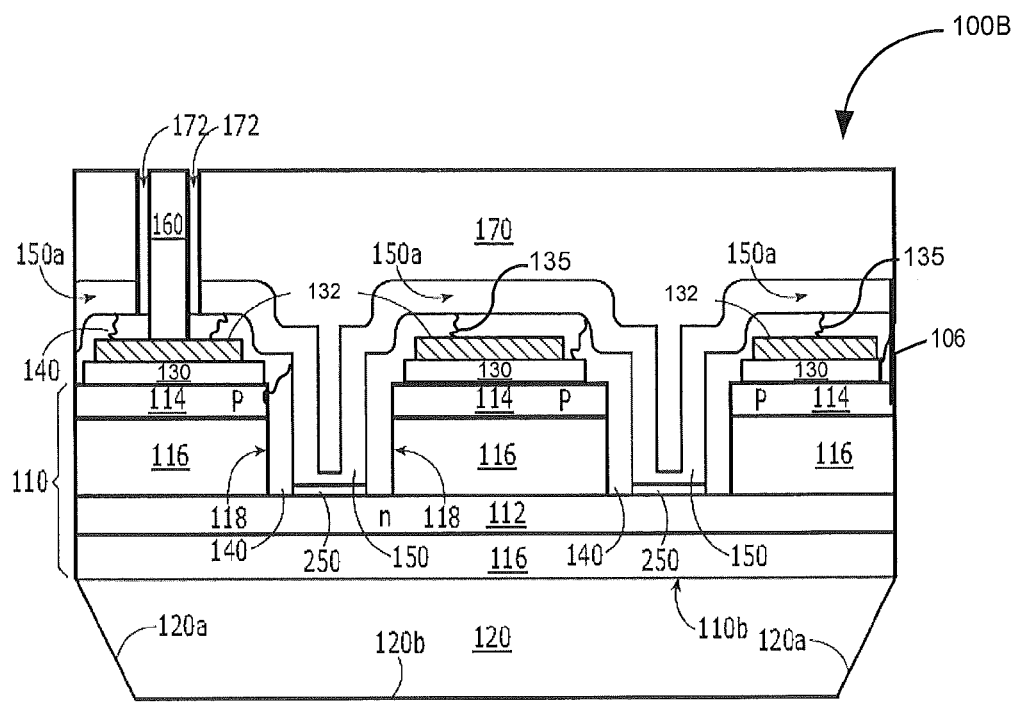

FIG. 2 is a cross-sectional view of an LED structure 100B according to other embodiments. In these embodiments, a reflective anode contact is provided in addition to a reflective cathode contact.

More specifically, in FIG. 2, a diode region 110 is provided as was described in connection with FIG. 1. A substrate 120 is also provided, although it need not be provided in other embodiments. The substrate 120 may be thinned relative to the thickness of the growth substrate. A reflective anode contact 130 is provided that ohmically contacts the p-type layer 114 and extends on the first face 110a. The reflective anode contact may include silver. In some embodiments, the reflective anode contact 130 may include a two-layer structure including, for example, about 5 Å of nickel (Ni) directly on the p-type layer 114 and about 1000 Å of silver (Ag) on the nickel, to thereby provide an "NiAg mirror" 130. The reflective anode contact 130 can reflect at least 90% of the visible light from the diode region 110 that impinges thereon. Other reflective layers that also provide an ohmic contact to p-type gallium nitride may be used in other embodiments. It will be understood that the reflectivity of the NiAg mirror is determined primarily by the Ag because only a very thin layer (in some embodiments less than about 10 Å) of Ni is used. Moreover, when annealed, this nickel may convert to nickel oxide to enhance the ohmic contact for the Ag to the p-type gallium nitride. Thus, the NiAg mirror 130 can have about the same reflectivity of Ag alone, but can provide a better contact and lower voltage to the p-type layer. In other embodiments, pure Ag may be used.

Surmounting the NiAg mirror 130 is a barrier layer 132 which may include sublayers comprising about 1000 Å of titanium tungsten (TiW), about 500 Å of platinum (Pt) and about 1000 Å of titanium tungsten (TiW). The titanium tungsten/platinum sublayers may repeat in multiple repetitions to provide a desired diffusion barrier. The diffusion barrier layer 132 generally is not reflective. Thus, the face of the NiAg mirror 130 that is directly on the p-type layer 114 provides a reflective structure.

Continuing with the description of FIG. 2, an insulating layer 140 is provided on the sidewalls of the via 118 and on the first face 110a outside the via 118. In some embodiments, as shown, the insulating layer 140 may also extend onto at least a portion of the NiAg mirror 130. In some embodiments, the insulating layer 140 may comprise about 1 μm of silicon nitride (SiN) and/or about 0.5 μm of silicon diode (SiO₂). The thickness of the transparent insulating layer may be configured to enhance the reflectivity from the reflective cathode contact 150, based on the operating wavelength of the LED and/or the index of refraction of the insulating layer, using techniques known to those skilled in the art. In particular, silicon dioxide may have an index of refraction of about 1.5 while SiN may have an index of refraction of about 2.0, both of which are less than the index of refraction of gallium nitride (about 2.5), so that an index mismatch or index step is provided by the insulating layer 140, which can actually enhance TIR from the diode region 110.

As also shown in FIG. 2, the reflective cathode contact 150 can ohmically contact the n-type layer 112, for example on the floor of the via 118 and can extend on the insulating layer 140 on the sidewall of the via 118, and may also extend onto the insulating layer 140 that is outside the via 118 as indicated by 150a. In some embodiments, the reflective cathode contact 150 may comprise about 1500 Å of aluminum. Thicker reflective cathode contacts also may be used. The hybrid reflector that includes the insulating layer 140 and the aluminum reflective cathode contact 150 can reflect at least 90% of the visible light from the diode region 110 that impinges thereon. In other embodiments, a separate ohmic contact layer 250 may be provided between the reflective cathode contact 150 and the n-type layer 112, to provide an ohmic contact to the n-type layer 112. In some embodiments, the ohmic contact layer 250 may comprise titanium, for example annealed titanium, or aluminum/titanium alloy It will be understood that the ohmic contact layer 250 may be used in any and all of the embodiments described herein between the reflective contact 150 and the n-type or p-type layer.

Finally, an anode bond pad 160 and a cathode bond pad 170 are provided. The anode bond pad 160 and the cathode bond pad 170 can include a stack of about 500 Å titanium (Ti), about 2000 Å nickel (Ni) and about 1-3 μm of 80/20 gold-tin (AuSn) alloy, to provide "TiNiAuSn pads". Other materials may be used, and not all of these layers may be used. For example, pure tin may be used as it has a lower melting point. Moreover, in other embodiments, a plating seed layer may be provided on the anode contact and on the reflective cathode contact, and at least a portion of the anode and/or cathode bond pads are plated on the seed layer. In still other embodiments, the reflective cathode contact 150 and/or the barrier layer 140 may provide the plating seed layer for plating the pads 160/170 thereon. The plated anode and cathode bond pads can also provide mechanical support and enhanced thermal efficiency.

Accordingly, embodiments of FIG. 2 may provide a reflective structure on the first face 110a that is configured to reflect substantially all light, for example, at least 90% of the light that emerges from the first face 110a back into the first face 110a. In embodiments of FIG. 2, the reflective structure comprises two different reflectors. More specifically, the reflective structure comprises a reflective surface of the anode contact 130 that ohmically contacts the p-type layer 114, a reflective surface of the cathode contact 150 that ohmically contacts the n-type layer 118 and a reflective surface of extensions 150a of the cathode contact 150 that extend between the reflective surface of the anode contact 130 that ohmically contacts the p-type layer 114 and the hybrid reflective surface of the cathode contact 150 in combination with the insulating layer 140. When viewed from the perspective of the diode region 110, substantially all the light that emerges from the diode region 110 into the anode and cathode contacts can be reflected back into the diode region. Thus, from an area standpoint, the reflective structure of FIG. 2 can reflect the light that emerges from at least 85% of the area of the first face, and in some embodiments, at least 90% of the area. In other words, at least 90% of the diode face can be covered by mirror. Moreover, since the reflective structure can comprise nickel-silver (anode contact 130) and aluminum (cathode contact 150), at least 90% of the light that impinges on the reflective structure may be reflected. In other words, the mirror may have at least 90% efficiency.

Other LED structures, such as the structures illustrated in U.S. Patent Publication No. 2009/0283787, the disclosure of which is incorporated herein by reference and which is assigned to the assignee of the present invention, included a barrier layer that surrounded the p-type ohmic contact and contacted the underlying p-type layer. Such a barrier layer formed a non-ohmic contact to the p-type layer and was optically absorbing, which caused some loss of light in the chip. Embodiments of the present invention protect the edges of the anode contact 130 with an insulating structure that forms a hybrid reflector with the cathode contact 150, which may increase the amount of light exiting the chip. As the barrier layer 130 is contained within the periphery of the reflective anode contact 130, it may not absorb light generated in the active region 116 of the LED chip, as it is hidden from the active region by the reflective anode contact 130.

When an LED chip structure as illustrated in FIG. 1 or 2 is flip-chip mounted onto a submount or other surface, mechanical force may be applied to the LED chip in a thermosonic or thermocompressive bonding process. In some bonding processes, such as a flux eutectic AuSn reflow attach process at 320° C., no external force may be applied to the chip. However, stress can be imparted to the LED chip due to mismatches in the coefficients of thermal expansion of various materials in the chip structure and the package substrate layers when the chip is bonded at high temperature. Even if a lower temperature mounting process is used, it may be desirable for an LED chip structure to be able to tolerate subsequent reflow temperatures of at least about, for example, 260° C. which may occur when the completed component is mounted onto a printed circuit board or other support substrate.

Many different bonding processes can impart mechanical stress to the LED chip, and in particular can impart mechanical stress to the insulating layer 140, potentially resulting in the formation of hairline cracks 135 in the insulating layer 140. In most locations, these hairline cracks 135 may not adversely affect the operation or reliability of the LED chip. However, if a hairline crack 135 occurs at a location where it extends from the anode contact 132 to an external surface of the chip, or to the cathode contact 150, then silver or other metal in the anode contact 130 can migrate through the hairline crack. This migration of metal can cause an electrical short to form between the anode contact 130 and the cathode contact 150, which can render the LED chip inoperable.

Figure 3:
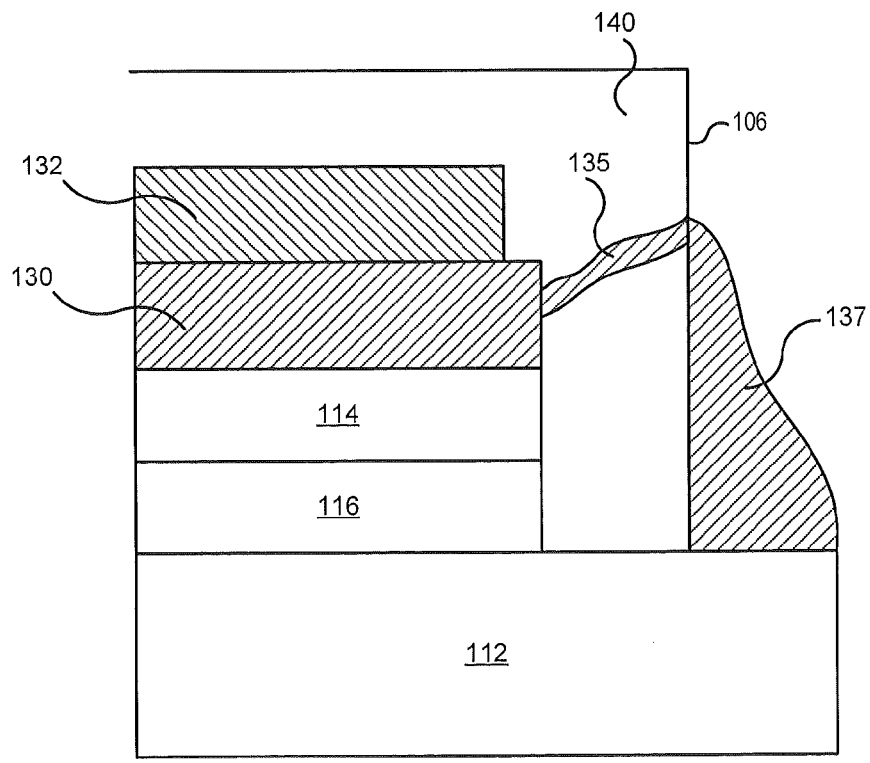
FIG. 3 is a detailed view of a portion of the LED structure shown in FIG. 2.

FIG. 3 is a detailed close-up view of a portion of the LED chip 100B shown in FIG. 2. As shown in FIG. 3, if a hairline crack 135 forms that extends from the anode contact 132 to an exterior surface 106 of the LED chip, silver or other metal in the anode contact 130 may migrate through the crack 135, and flow onto the outside of the chip. An unwanted external metal flow 137 may contact the n-type layer 112, which can also result in an undesirable electrical short circuit.

Silver migration may be exacerbated by the presence of moisture. Thus, for example, cracks occurring in the insulating layer 140 near an outer surface or edge surface of the LED chip structure may be more susceptible to the formation of electric short circuits due to silver migration.

Some embodiments of the present inventive concepts may mitigate the effect of cracks in the insulating layer 140 so that such cracks may not propagate entirely through the insulating layer 140, and/or may not provide a migration path in an area that is likely to result in an electrical short-circuit.

FIGS. 4A to 8B illustrate methods of forming an LED structure 100C including a crack-tolerant transparent insulating layer in accordance with some embodiments. In particular, FIGS. 4A, 5A, 6A, 7A, and 8A are plan views of intermediate LED device structures, and FIGS. 4B, 5B, 6B-F, 7B and 8B are cross-sections of the intermediate LED device structures shown in FIGS. 4A, 5A, 6A, 7A, and 8A, respectively.

Figure 4A:
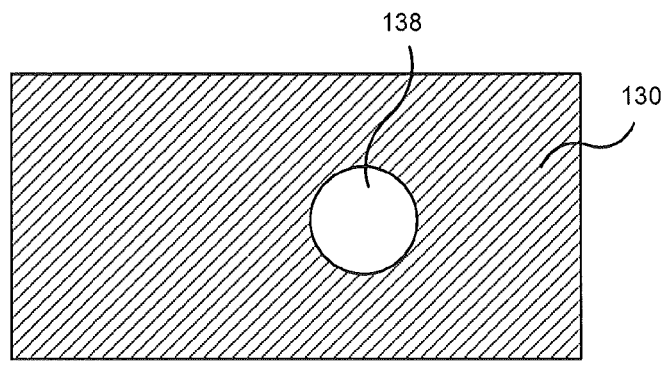
FIGS. 4A, 5A, 6A, 7A, and 8A are plan views of intermediate LED device structures fabricated in accordance with some embodiments.
Figure 4B:
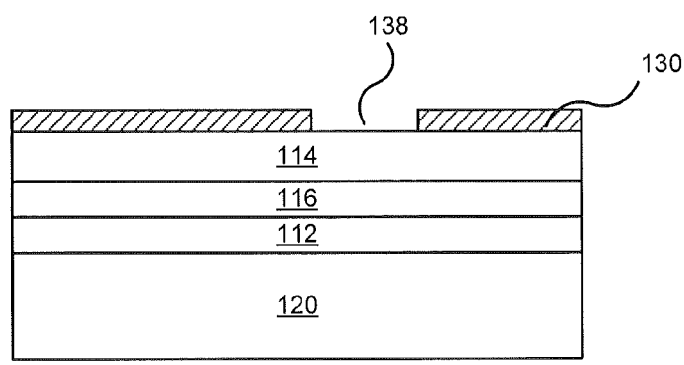
FIGS. 4B, 5B, 6B-F, 7B and 8B are cross-sections of the intermediate LED device structures shown in FIGS. 4A, 5A, 6A, 7A, and 8A, respectively.

Referring to FIGS. 4A and 4B, a preliminary LED device structure includes an optional substrate 120, one or more n-type layers 112, an active region 116, and one or more p-type layers 114. The structure and composition of these layers is described in detail above and will not be repeated for brevity. The substrate 120 may include light extraction features as illustrated above in connection with FIG. 1. However, such features are omitted from the following figures for clarity.

For convenience, the active region 116 will be omitted from subsequent figures. However, it is understood that an active region will generally be present between the n-type layers 112 and the p-type layers 114.

Referring still to FIGS. 4A and 4B, a layer 130 of a reflective material, such as silver or nickel silver, is deposited on the upper surface of the p-type layers 114 as a reflective anode contact. The reflective layer 130 is patterned to form an aperture 138 in which the via 118 will be formed.

Figure 5A:
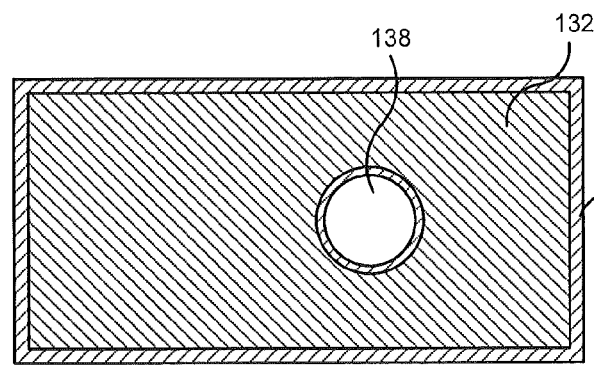
Figure 5B:
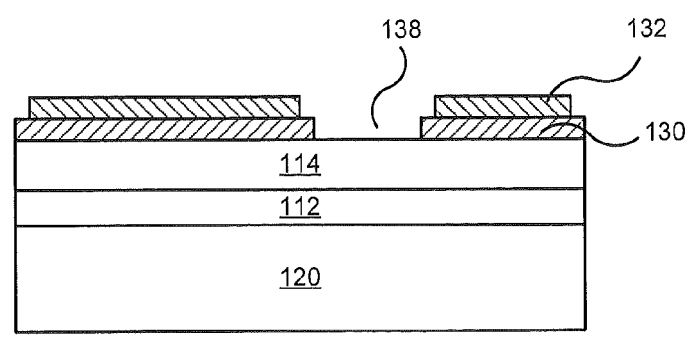

Referring to FIGS. 5A and 5B, a barrier layer 132 of, for example, titanium tungsten, tungsten, platinum or other suitable material is deposited on the reflective anode contact 130 and patterned to expose the aperture 138. The outer edges of the barrier layer 132 may be slightly recessed back from the peripheral edges of the reflective anode contact 130.

Figure 6A:
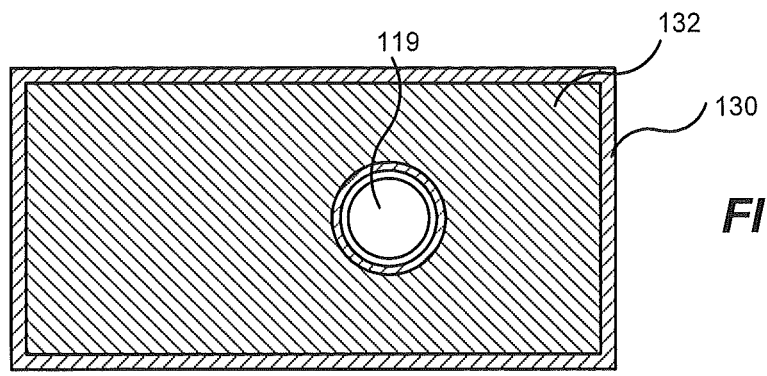
Figure 6B:
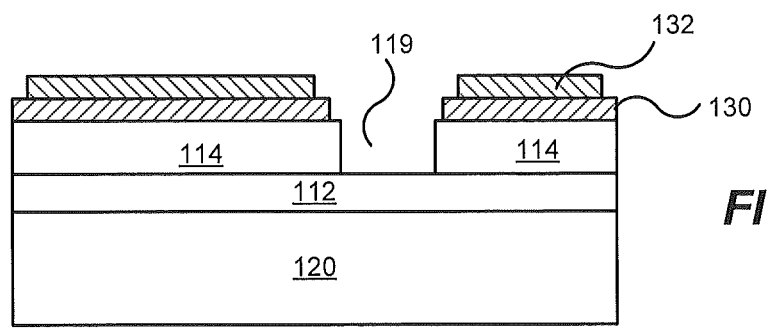

Referring to FIGS. 6A and 6B, a via 119 may be etched through the p-type layers 114 and the active region 116 (not shown) down to the n-type layers 112. A separate mask may be used or the reflective anode contact 130 and/or barrier layer 132 may be used as an etch mask to form the via 119.

Figure 6C:
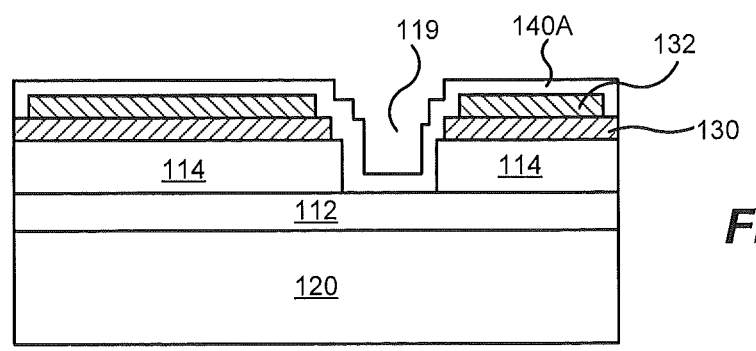

Referring to FIG. 6C, a base insulating layer 140A may be blanket-deposited over the structure to cover the exposed portions of the transparent anode contact 130 and the barrier layer 132. The insulating layer 140A may extend into the via 119 and onto exposed portions of the p-type layers 114, the active layers 116 (not shown) and the n-type layers 112. The base insulating layer 140A may include a dielectric material, such as SiN, $SiO_2$, etc., and may have a thickness of between about 250 nm and 1 micron, and in particular embodiments may have a thickness of about 500 nm.

Figure 6D:
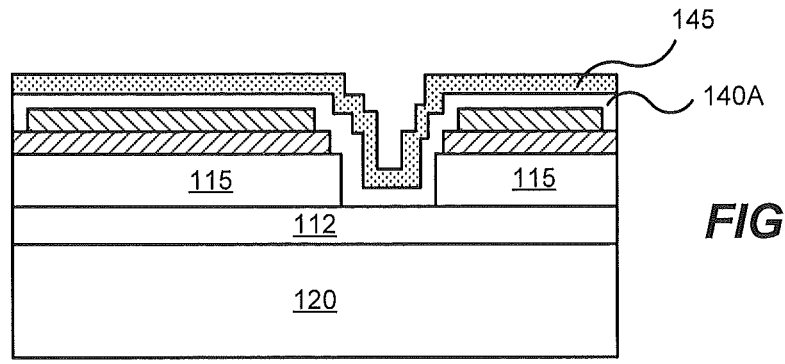

Referring to FIG. 6D, a crack reducing interlayer 145 is deposited over the base insulating layer 140A. In particular, the crack reducing interlayer 145 may include a material that is capable of reducing the propagation of cracks through the insulating layer. Thus, the crack reducing interlayer 145 may in some embodiments have a composition different than the insulating layer. While not wishing to be bound by a particular theory, it is presently believed that the crack reducing layer may stop cracks from propagating through the insulating layer when the crack reducing layer has a different fracture mode compared to the insulating layer. For example, silicon dioxide is characterized by having a brittle fracture mode, while metals typically have a ductile fracture mode. When a material has a ductile fracture mode, it undergoes plastic deformation before fracturing, while a material with a brittle fracture mode may not exhibit plastic deformation before fracturing. Providing a material with a ductile fracture mode as an interlayer within an insulating material having a brittle fracture mode may result in reduction of crack propagation, because the stress that causes cracks to propagate through the (brittle) insulating layer may not cause enough plastic deformation in the (ductile) interlayer to allow it to crack. Moreover, the cracks may themselves may provide some amount of strain relief to the insulating layer, which may reduce the amount of strain applied to the interlayer.

The crack reducing layer may also form an interface with the insulating layer that relieves stress in the structure when the crack propagates to the interface. That is, for example, slippage at the interface between the insulating layer and the crack reducing layer may result in stress relief at the interface, which may stop the propagation of cracks.

In some embodiments, the crack reducing interlayer 145 may include a material other than a dielectric material. In some embodiment, the crack reducing interlayer 145 may include a non-crystalline material, such as an amorphous material. The crack reducing interlayer 145 may include, for example, a metal such as aluminum (Al), titanium (Ti), tungsten (W), AlTi, AlTiW, TiW, or other metal. In some embodiments, the crack reducing interlayer 145 may include a polymer material, such as benzocyclobutene (BCB), polyimide, etc. In some embodiments, the polymer material may be a ductile polymer.

In order to withstand subsequent processing steps, the polymer may be a high temperature polymer, and in some embodiments may be able to tolerate temperatures up to about 300° C. or more.

The crack reducing interlayer 145 may have a thickness of about 10 nm to 1 micron. When the crack reducing interlayer 145 includes Al, the crack reducing interlayer 145 may have a thickness of about 150 nm.

In some embodiments, the crack reducing interlayer 145 may be fabricated to be thin enough as to be optically transparent. In other embodiments, the crack reducing interlayer 145 may be optically absorbing. For example, since the layer 130 may be reflective, light generated in the device may be reflected away from the crack reducing interlayer 145 and not absorbed thereby. In some embodiments, the crack reducing interlayer 145 may itself be reflective, such as when the crack reducing interlayer 145 comprises aluminum.

Figure 6E:
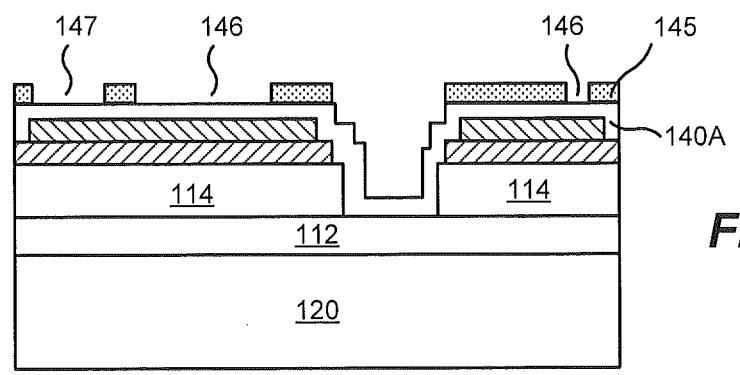
Figure 7A:
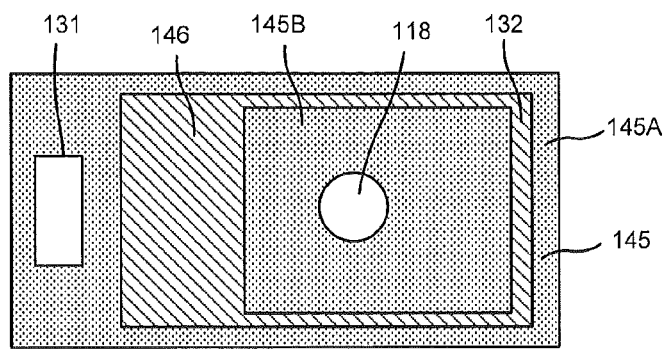

Referring to FIG. 6E, the crack reducing interlayer 145 may be patterned using, for example, photolithography, to form a gap or moat 146 that separates the crack reducing interlayer 145 into two separate portions 145A and 145B as shown in FIG. 7A and discussed in more detail below. The crack reducing interlayer 145 may also be patterned to form an aperture 147 therein that will be used to define a contact location for the anode contact of the device, as discussed in more detail below.

Figure 6F:
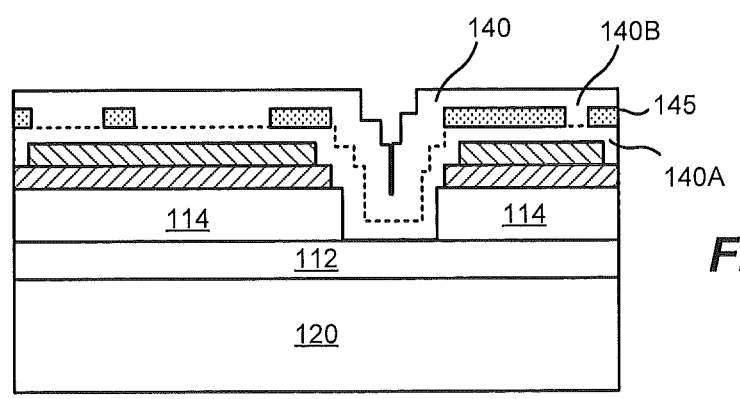

Referring to FIG. 6F, an upper insulating layer 140B may be blanket deposited over the structure. The upper insulating layer 140B may have the same composition or a different composition as the lower insulating layer 140A. The upper insulating layer 140B may include a dielectric material, such as SiN and/or $SiO_2$, and may have a thickness of about 250 nm to about 1 micron. In particular embodiments, the upper insulating layer 140B may include SiN, and may have a thickness of about 500 nm. In some embodiments, the thickness of the upper and lower insulating layers 140A, 140B may be selected based on the level of voltage that such layers may be required to withstand for electrostatic discharge protection. For example, if a portion of the crack reducing interlayer 145 is electrically connected to the cathode contact, the base insulating layer 140A may be required to withstand a voltage of at least about 50 V.

Figure 7B:
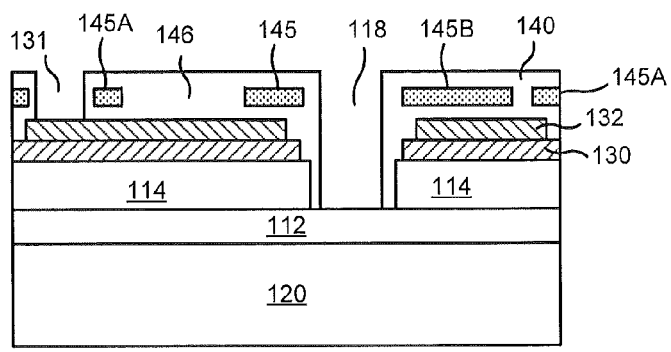
Figure 9:
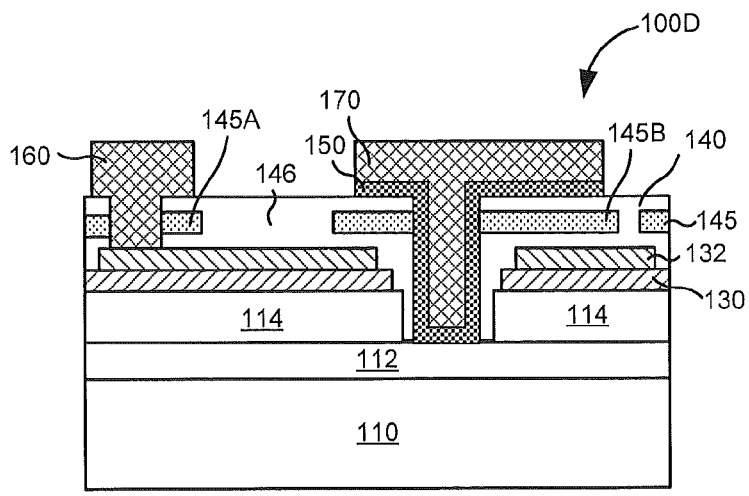
FIGS. 9, 10A, 10B and 11 are cross-sectional views of light emitting diodes according to various further embodiments.

Referring to FIGS. 7A and 7B, the insulating layer 140 including the base insulating layer 140A, the crack reducing interlayer 145 and the upper insulating layer 140B may be patterned to open first and second vias 131 and 118 therein. The first via 131 extends through the insulating layer 140 to the barrier layer 132, while the second via 118 extends through the insulating layer 140 to the n-type layers 112. As shown in FIG. 7B, the crack reducing interlayer 145 may be spaced apart from the vias 131, 118 so that sidewalls of the crack reducing interlayer 145 are not exposed by the vias 131, 118. However, in other embodiments, one or both of the vias 131, 118 may expose portions of the crack reducing interlayer 145, as illustrated in FIG. 9, and discussed in more detail below.

Figure 8A:
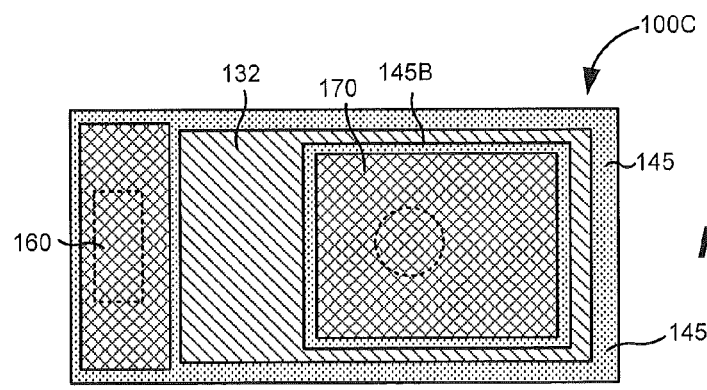
Figure 8B:
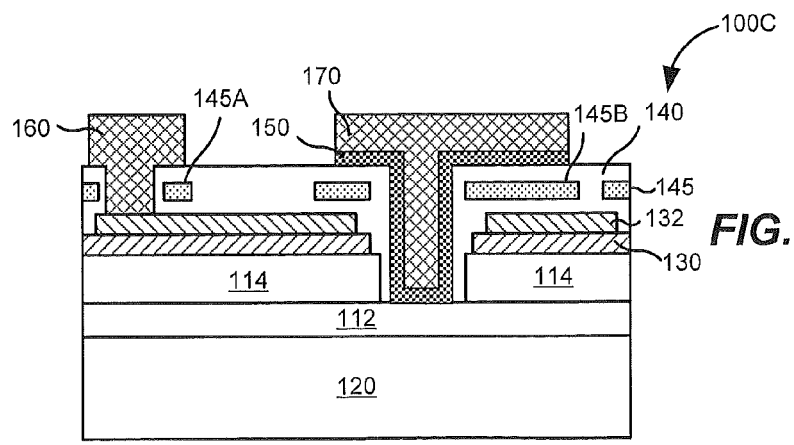

The gap or moat 146 that separates the crack reducing interlayer 145 into two separate portions 145A and 145B is illustrated in FIG. 7A Referring to FIGS. 8A and 8B, a reflective cathode contact 150 is formed within the second via 118, and may extend onto the insulating layer 140 over the p-type layers and over the crack reducing interlayer 145. A cathode bond pad 170 is formed on the reflective cathode contact 150, and an anode bond pad 160 is formed in the first via 131 to contact the barrier layer 132. Additional layers, such as adhesive or bonding layers may also be included. The outside edges of the anode bond pad 160 may be formed within the periphery of the first crack reducing interlayer portion 145A, and the outside edges of the reflective cathode contact 150 and the cathode bond pad 170 may be formed within the periphery of the second crack reducing interlayer portion 145B as best seen, for example, in the plan view of FIG. 8A.

The presence of the crack reducing interlayer 145 within the insulating layer 140 may prevent or reduce cracks that form in the insulating layer 140 from penetrating completely through the insulating layer 140 so as to form migration paths for metal in the device. That is, although cracks can still form in the insulating layer 140, such cracks may not lead to the formation of electrical short circuits that can damage the device. While not wishing to be bound by any particular theory, it is presently believed that the interface between the crack reducing interlayer 145 and the insulating layer 140 provides a mechanical discontinuity that can reduce the propagation of cracks through the insulating layer 140. Accordingly, any material that provides a suitable mechanical discontinuity with the insulating layer 140 may be suitable for use as the crack reducing interlayer 145, regardless of whether such material is electrically conductive or electrically insulating. The material of the crack reducing interlayer 145 may be transparent, reflective, or opaque.

In the mounting process, mechanical stress may be placed on the LED chip through the anode bond pad 160 and/or the cathode bond pad 170. Thus, cracks in the insulating layer 140 may tend to originate underneath these pads. Accordingly, a device according to some embodiments may be designed such that the anode bond pad 160 and the cathode bond pad 170 are formed within the periphery of the respective portions 145A, 145B of the crack reducing interlayer 145, so that any cracks that form in the upper portion 140B of the transparent insulating layer underneath the pads may be less likely to propagate through the insulating layer 140 to the barrier layer 132 or the reflective anode contact 130.

The respective portions 145A, 145B of the crack reducing interlayer 145 may be electrically isolated from one another by the gap 146 (FIG. 7B) to reduce the possibility of a short circuit.

FIG. 9 is a cross sectional view of an LED chip structure 100D in accordance with further embodiments. As shown therein, the portion 145A of the crack reducing interlayer 145 may contact the anode bond pad 160, while the portion 145B of the crack reducing interlayer 145 may contact the cathode bond pad 160 and/or the reflective cathode contact 150. Thus, in embodiments where the crack reducing interlayer 145 includes a conductive material such as aluminum, one or both of the portions 145A, 145B of the crack reducing interlayer 145 may be electrically active. However, as the portions 145A, 145B of the crack reducing interlayer 145 are isolated from one another by the gap or moat 146, such contact may not cause a short circuit.

Figure 10A:
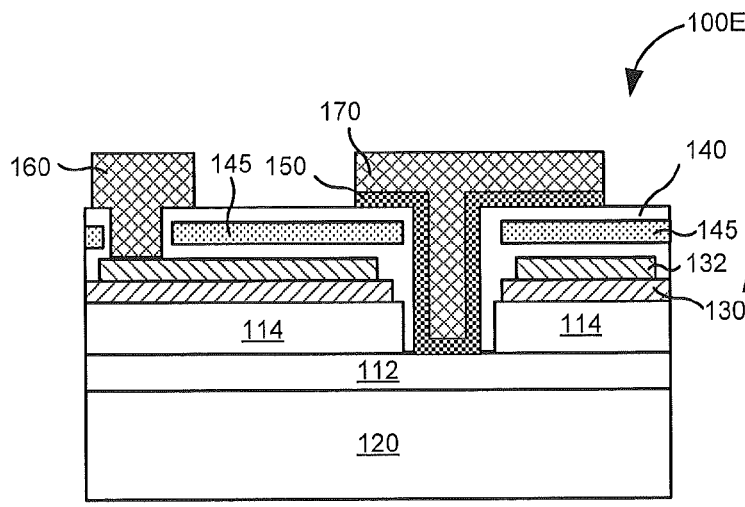

FIG. 10A is a cross sectional view of an LED chip structure 100E in accordance with further embodiments. In the embodiment shown in FIG. 10A, the crack reducing interlayer 145 does not include a gap. However, the crack reducing interlayer 145 is spaced apart from the anode and cathode contacts by portions of the insulating layer 140 so that it is electrically isolated (floating).

Figure 10B:
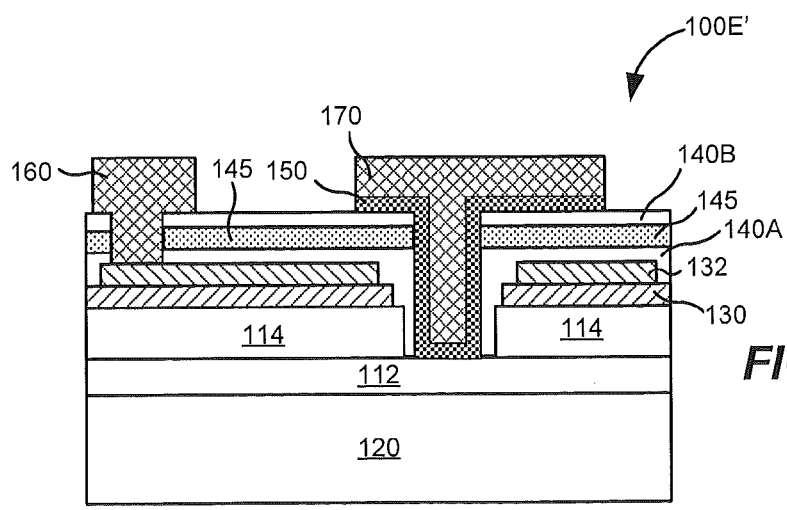

FIG. 10B is a cross sectional view of an LED chip structure 100E' in accordance with further embodiments. In the embodiment shown in FIG. 10B, the crack reducing interlayer 145 does not include a gap and is not spaced apart from the anode and cathode contacts of the device by portions of the insulating layer 140. In the embodiments of FIG. 10B, the crack reducing interlayer 145 may be an electrically insulating material, such as BCB, and the insulating layer 140 may thereby have structure including three distinct layers 140A, 145 and 140B.

Figure 11:
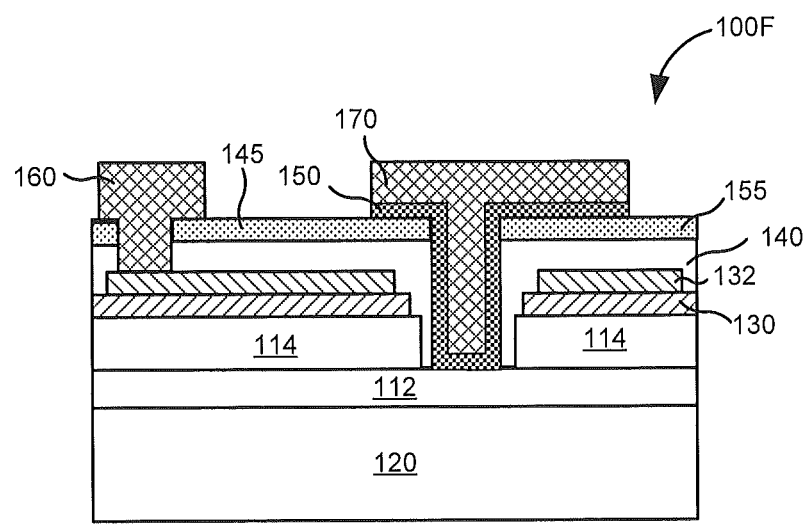

FIG. 11 is a cross sectional view of an LED chip structure 100F in accordance with further embodiments. In the embodiment shown in FIG. 11, a crack reducing layer 155 is on the insulating layer 140 between the insulating layer 140 and the bond pads 160, 170. In the embodiments illustrated in FIG. 11, the crack reducing layer 155 may be formed of an electrically insulating material, such as a polymer.

Figure 12A:
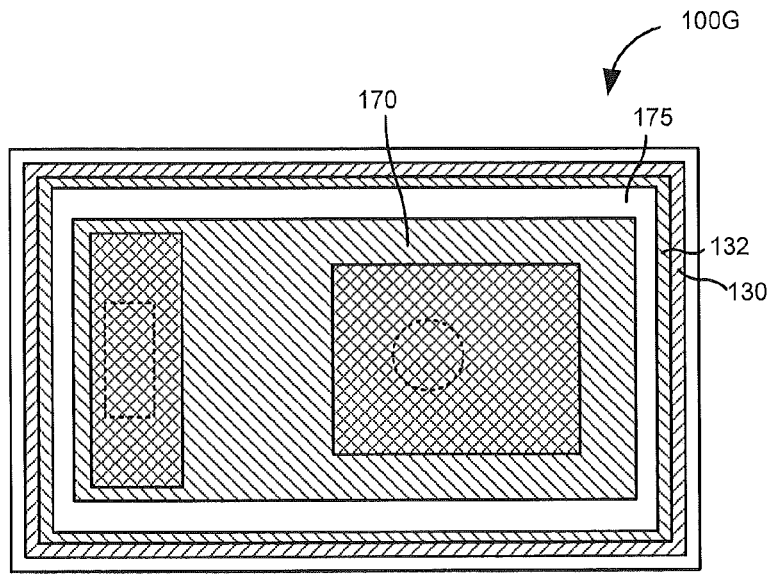
FIG. 12A is a plan view of an LED structure according to some further embodiments.
Figure 12B:
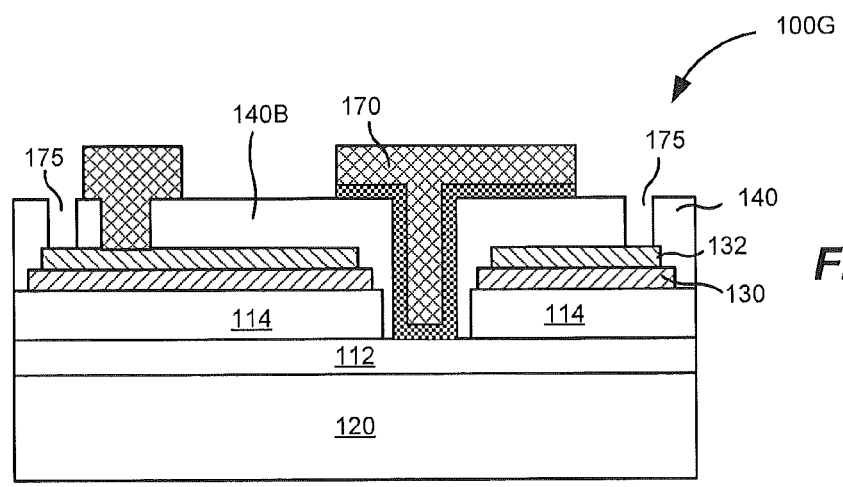
FIGS. 12B and 12C are cross sectional views of the LED structure of FIG. 12A according to various embodiments.

FIGS. 12A and 12B are a plan view and a cross sectional view, respectively, of an LED device structure 100G that has a crack-tolerant transparent insulating layer according to further embodiments. The LED structure shown in FIGS. 12A and 12B includes an optional substrate 120, n-type layers 112, p-type layers 114, a reflective anode contact 130, a barrier layer 132, an insulating layer 140, an anode bond pad 160 and a cathode bond pad 170.

In the LED structure shown in FIGS. 12A and 12B, the portion 140A of the insulating layer 140 near the peripheral edges of the chip are mechanically isolated from the portions of the insulating layer 140 underneath the anode bond pad 160 and the cathode bond pad 170 by a trench 175 that extends around the anode bond pad 160 and the cathode bond pad 170. The trench 175 extends through the insulating layer 140 to the barrier layer 132.

Peripheral portions 140A of the insulating layer 140 remain on and protect the external edges of the reflective anode contact 130. However, any cracks that may develop underneath the anode bond pad 160 and/or cathode bond pad 170 may not propagate to the external edges of the reflective anode contact that are most susceptible to moisture-assisted metal migration. Accordingly, cracks that form in the insulating layer 140 underneath the anode bond pad 160 and/or cathode bond pad 170 may not result in undesirable short circuits due to metal migration.

An optional second passivation layer including about 150 nm of SiN may be deposited on the structure to cover the portions of the barrier layer 132 exposed by the trench 175.

Figure 12C:
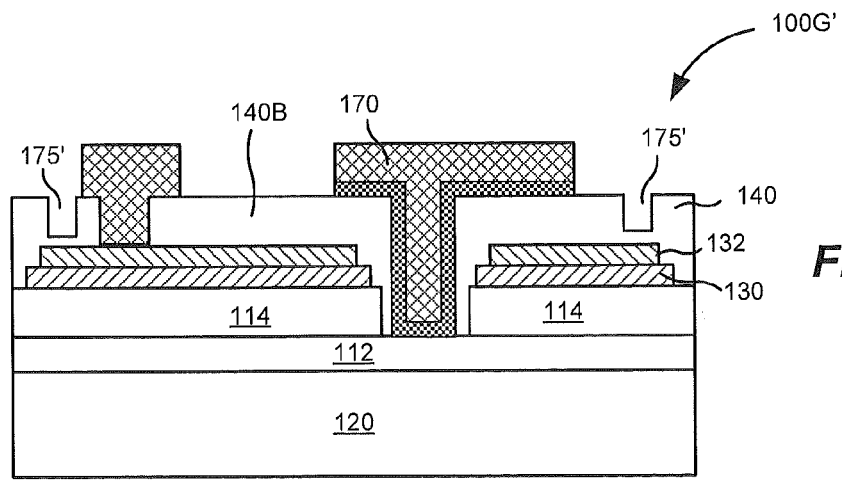

FIG. 12C is a cross sectional view of a device structure 100G' in accordance with further embodiments. The device structure 100G' is similar to the device structure 100G shown in FIG. 12B, except that the trench 175' does not extend completely through the insulating layer 140 to contact the barrier layer 132. Even though the trench 175' does not extend completely through the insulating layer 140, the trench 175' may still be effective to block a significant number of cracks from propagating to the edge of the structure and causing failures, while still providing protection to the entire upper surface of the barrier layer 132. Thus, the trench 175' may not need to provide physical complete separation of the insulating layer 140 to be effective.

Figure 13A:
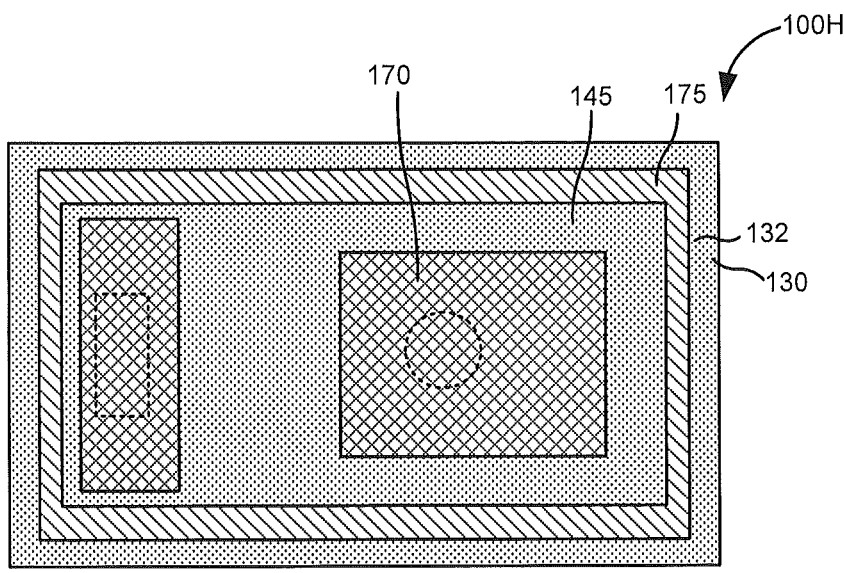
FIG. 13A is a plan view of an LED structure according to some further embodiments.
Figure 13B:
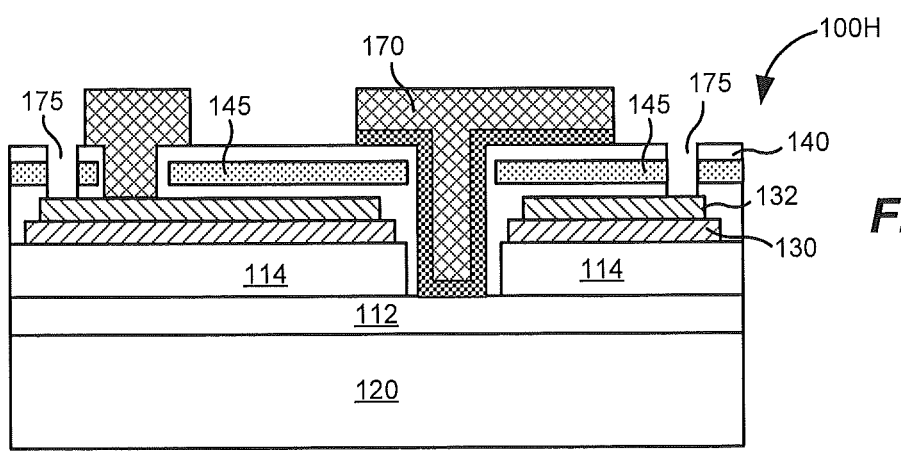
FIGS. 13B and 13C are cross sectional views of the LED structure of FIG. 13A according to various embodiments.

Reference is now made to FIGS. 13A and 13B, which are a plan view and a cross sectional view respectively of an LED device structure 100H that has a crack-tolerant insulating layer according to still further embodiments. The LED structure 100H includes both a trench 175 for mechanically isolating peripheral portions 140A of an insulating layer 140 as well as an crack reducing interlayer 145 within the insulating layer 140 for preventing or reducing the propagation of cracks through the insulating layer 140. The combination of both an crack reducing interlayer 145 and a trench 175 may further reduce the possibility of unwanted metal migration in the structure.

Figure 13C:
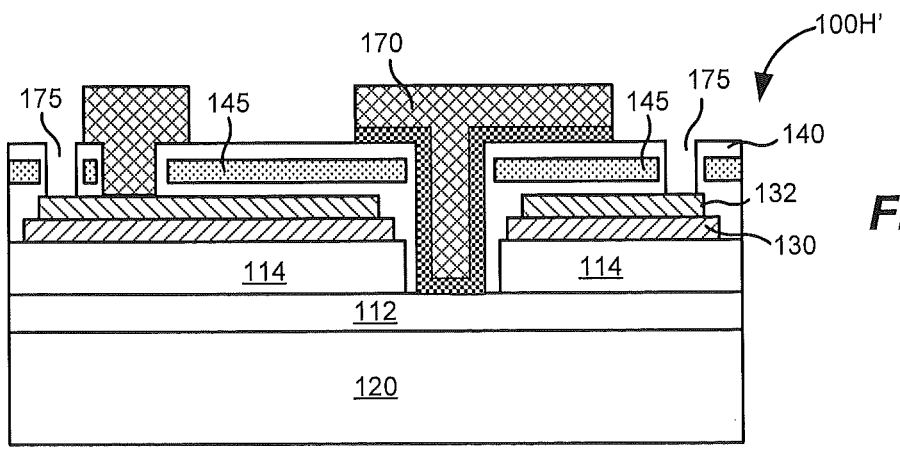

FIG. 13C is a cross sectional view of an LED structure 100H' according to still further embodiments. In the LED structure 100H', the crack reducing interlayer 145 is set back from the sidewalls of the trench 175. That is, the crack reducing interlayer 145 is insulated from the sidewalls of the trench 175 by portions of the insulating layer 140.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments and, although specific terms are employed, they are used in a generic and descriptive sense only and not for purposes of limitation, the scope of the inventive concepts being set forth in the following claims.

What is claimed is:

1. A light emitting device, comprising:
an epitaxial region;
an insulating layer on the epitaxial region;
a bond pad on the insulating layer; and
a crack reducing layer between the insulating layer and the bond pad, wherein the crack reducing layer is configured to reduce the propagation of cracks in the insulating layer between the epitaxial layer and the bond pad;
wherein the crack reducing layer is embedded within the insulating layer.

2. The light emitting device of claim 1, wherein the crack reducing layer is electrically isolated by the insulating layer from the bond pad and the epitaxial region.

3. The light emitting device of claim 1, wherein the insulating layer comprises an aperture, wherein the bond pad extends through the aperture, and wherein the bond pad extends laterally over the crack reducing layer so that the crack reducing layer is between the bond pad and the epitaxial region.

4. The light emitting device of claim 3, wherein an entire periphery of the bond pad lies within a periphery of the crack reducing layer.

5. The light emitting device of claim 1, wherein the bond pad comprises a cathode bond pad, the light emitting device further comprising an anode bond pad on the insulating layer;
wherein the crack reducing layer comprises a first portion between the anode bond pad and the epitaxial region and a second portion between the cathode bond pad and the epitaxial region, wherein the first and second portions of the crack reducing layer are separated from one another.

6. The light emitting diode of claim 5, wherein the first portion of the crack reducing layer is separated from the anode bond pad by the insulating layer and the second portion of the crack reducing layer is separated from the cathode bond pad by the insulating layer.

7. The light emitting diode of claim 5, wherein the first portion of the crack reducing layer is in contact with the anode bond pad and the second portion of the crack reducing layer is in contact with the cathode bond pad.

8. The light emitting device of claim 1, wherein the crack reducing layer comprises a conductive metal layer.

9. The light emitting device of claim 1, wherein the crack reducing layer comprises a polymer.

10. The light emitting diode of claim 1, further comprising a trench in the insulating layer surrounding the bond pad, wherein the trench is within the periphery of the light emitting diode.

11. The light emitting diode of claim 10, wherein the trench extends completely through the insulating layer.

12. The light emitting diode of claim 10, wherein the trench extends into, but not completely through the insulating layer.

13. The light emitting diode of claim 10, further comprising a metal layer on the epitaxial region, wherein the insulating layer is between the metal layer and the bond pad, and wherein the trench extends completely through the insulating layer to the metal layer.

14. The light emitting diode of claim 13, wherein the insulating layer covers an outermost edge of the metal layer.

15. The light emitting diode of claim 10, wherein the crack reducing layer is exposed in the trench.

16. The light emitting diode of claim 10, wherein the crack reducing layer is separated from the trench by the insulating layer.

17. The light emitting device of claim 1, wherein the crack reducing layer has a ductile fracture mode.

18. A light emitting device, comprising:
an epitaxial region;
an insulating layer on the epitaxial region;
a bond pad on the insulating layer; and
a crack reducing feature in the insulating layer, wherein the crack reducing feature is configured to stop the propagation of cracks in the insulating layer to an outside surface of the insulating layer;
wherein the crack reducing feature comprises a trench in the insulating layer, wherein the trench is within the periphery of the light emitting diode and mechanically isolates peripheral edges of the light emitting device from portions of the insulating layer underneath the bond pad.

19. The light emitting device of claim 18, wherein the crack reducing feature further comprises a crack reducing interlayer in the insulating layer.

20. The light emitting device of claim 18, wherein the trench surrounds the bond pad.

21. The light emitting diode of claim 20, wherein the trench extends completely through the insulating layer.

22. The light emitting diode of claim 20, wherein the trench extends into, but not completely through the insulating layer.

23. The light emitting diode of claim 20, further comprising a metal layer on the epitaxial region, wherein the insulating layer is between the metal layer and the bond pad, and wherein the trench extends completely through the insulating layer to the metal layer.

24. The light emitting diode of claim 23, wherein the insulating layer covers an outermost edge of the metal layer.

25. The light emitting device of claim 18, wherein the crack reducing layer has a ductile fracture mode.

* * * * *